United States Patent [19]

Lloyd et al.

[11] Patent Number: 4,959,511
[45] Date of Patent: Sep. 25, 1990

[54] PEN CORD TENSIONING DEVICE

[75] Inventors: Graham P. Lloyd, Fremont; Dennis R. Mitchell, San Jose, both of Calif.

[73] Assignee: Grid Systems, Fremont, Calif.

[21] Appl. No.: 364,924

[22] Filed: Jun. 12, 1989

[51] Int. Cl.$^5$ ............................................. G08C 21/00
[52] U.S. Cl. ...................................... 178/18; 267/174; 267/179
[58] Field of Search ...................... 178/87, 18, 19, 20; 267/71, 286, 166, 169, 170, 174, 176, 179

[56] References Cited

U.S. PATENT DOCUMENTS

| | | | |
|---|---|---|---|
| 3,618,029 | 11/1971 | Graven | 340/172.5 |
| 4,490,607 | 12/1984 | Pease | 250/227 |
| 4,492,819 | 1/1985 | Rodgers et al. | 178/18 |
| 4,667,182 | 5/1987 | Murphy | 340/407 |
| 4,705,942 | 11/1987 | Budrikis | 250/227 |

FOREIGN PATENT DOCUMENTS 995670 6/1965 United Kingdom .

Primary Examiner—Stafford D. Schreyer
Attorney, Agent, or Firm—Townsend & Townsend

[57] ABSTRACT

This invention relates to an expansion device to permit the conductor to be extended beyond its normal operational length without breaking the electrical connection between the objects. In the preferred embodiment of the invention, a spring maintains the conductor at a predetermined length. The spring permits the conductor to be moved away from one of the objects for a predetermined distance without breaking the electrical connection between the objects. Preferably, the spring itself is conductive and connects two portions of the conductor which are relatively non-expandable. Alternatively, the spring in its relaxed state may merely maintain some slack in the conductor, the slack being taken up when the spring is compressed. In either embodiment, the spring tensioning mechanism may be contained entirely within one of the objects.

15 Claims, 2 Drawing Sheets

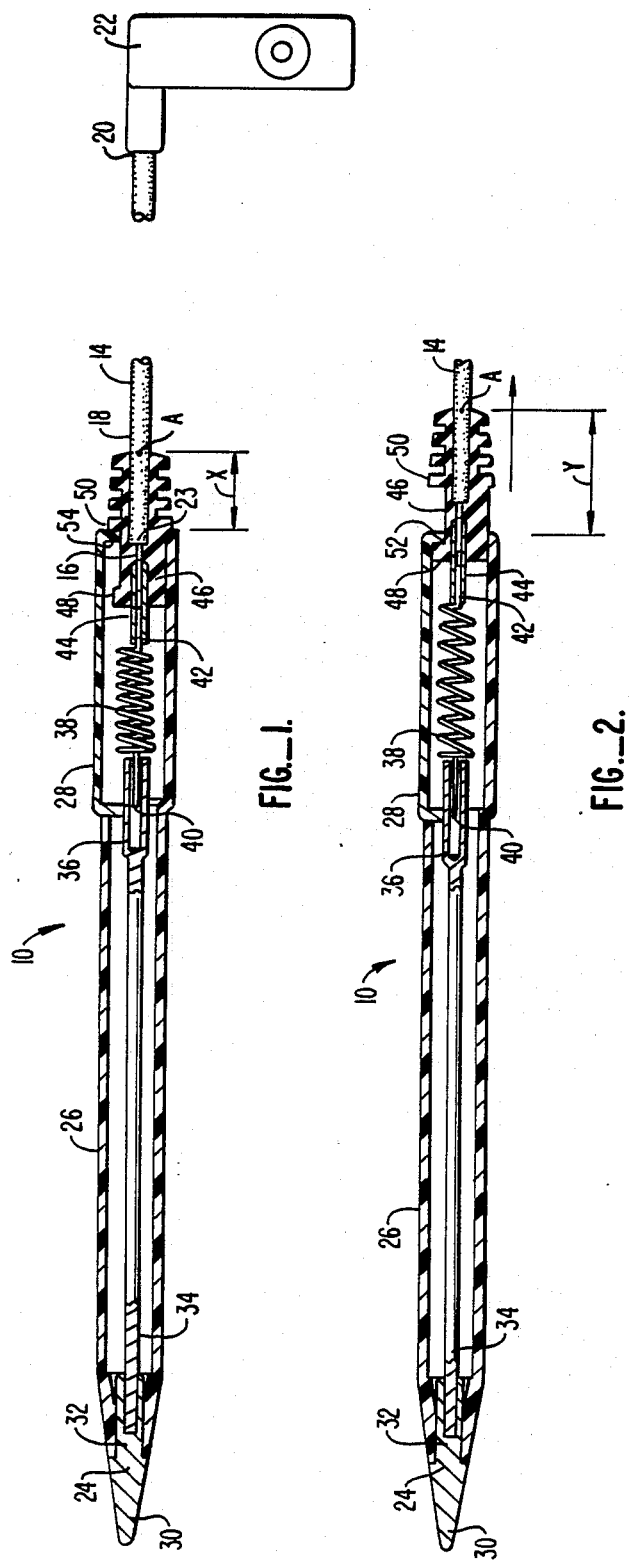

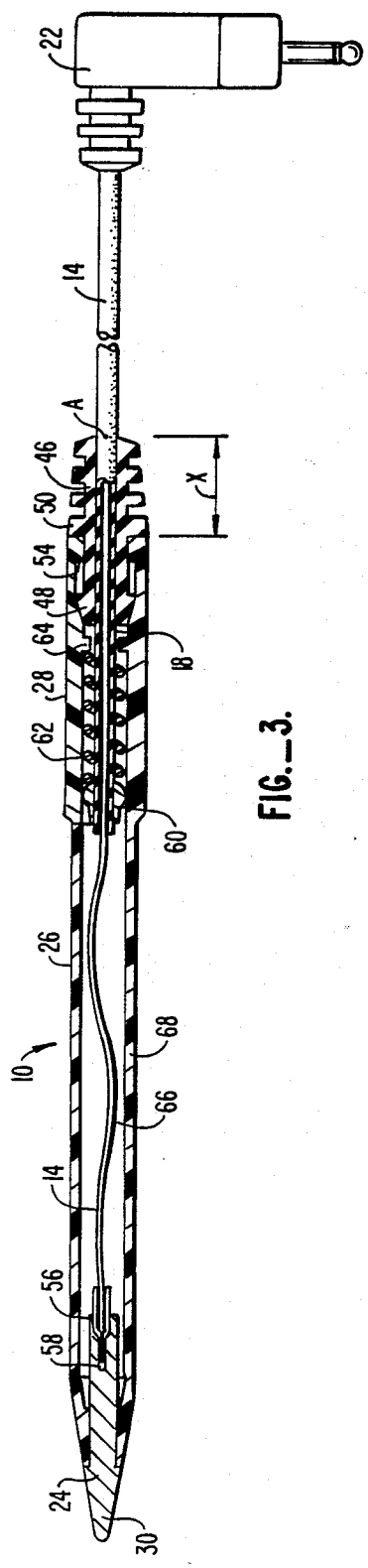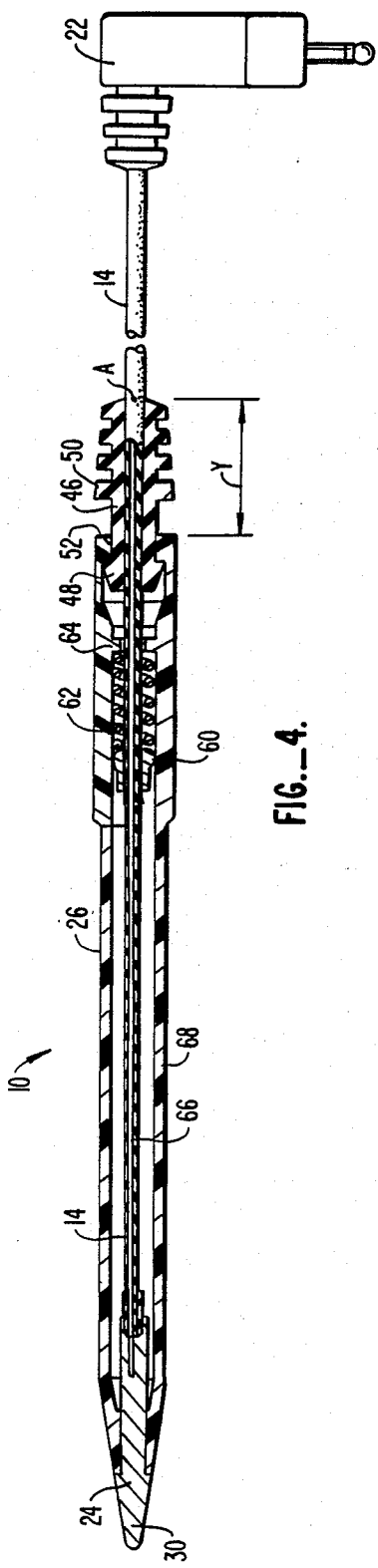
FIG._3.　　FIG._4.

PEN CORD TENSIONING DEVICE

BACKGROUND OF THE INVENTION

This invention relates to a device for adding tension to an electrical conductor, particularly to the cord of an electronic stylus.

It is not uncommon for one object to be attached to another object solely by an electrical conductor which transmits electrical signals between the two objects. One example of this situation is the attachment of a peripheral input/output device such as an electronic stylus to the body of a hand-held computer. Using the electrical cord to attach the stylus to the computer eliminates the need for any additional attachment mechanisms.

SUMMARY OF THE INVENTION

When attaching one object to another via an electrical conductor, however, there is a danger of overextending the conductor and breaking the electrical connection between the objects. What is needed, therefore, is a mechanism for permitting the conductor to be extended beyond its normal operating length without breaking the electrical connection between the two objects.

This invention meets this need by providing an expansion device to permit the conductor to be extended beyond its normal operational length without breaking the electrical connection between the objects. In the preferred embodiment of the invention, a spring maintains the conductor at a predetermined length. The spring permits the conductor to be moved away from one of the objects for a predetermined distance without breaking the electrical connection between the objects. Preferably, the spring itself is conductive and connects two portions of the conductor which are relatively non-expandable.

Alternatively, the spring in its relaxed state may merely maintain some slack in the conductor, the slack being taken up when the spring is compressed. In either embodiment, the spring tensioning mechanism may be contained entirely within one of the objects.

BRIEF DESCRIPTION OF THE DRAWINGS

FIG. 1 is a sectional view of the preferred embodiment in an unextended position:

FIG. 2 is a sectional view of the preferred embodiment in an extended position;

FIG. 3 is a sectional view of an alternative embodiment in an unextended position; and FIG. 4 is a sectional view of an alternative embodiment in an extended position.

DETAILED DESCRIPTION OF THE PREFERRED EMBODIMENTS

The preferred embodiment of this invention relates to the connection of an electronic stylus to a hand-held computer. As shown in FIGS. 1 and 2, an electronic stylus 10 is connected to a computer (not shown) via cord 14. A stylus for use as a computer peripheral input/output device must be slim, light-weight and easily held like a pen or pencil. In the preferred embodiment of this invention, the stylus is formed from a moldable plastic. Other materials may be used so long as the weight and size parameters are met.

Cord 14 is a standard insulated wire with an electrically conductive element 16 such as copper or a copper alloy surrounded by an insulator 18 such as plastic or rubber. At one end 20, cord 14 is attached to a connector 22 which is adapted to make an electrical connection with a port (not shown) on computer 12. The other end 23 of cord 14 is disposed within stylus 10.

Stylus 10 is formed in three parts: an electrically conductive tip 24, a hollow body 26 and a cover 28. Tip 24 has a contact portion 30 which extends beyond body 26 and a tube portion 32 which is disposed within body 26. Tube portion 32 surrounds and makes electrical contact with a rod 34 within body 26. Preferably, rod 34 is formed from brass, but any electrically conductive material may be used.

Rod 34 extends from tip 24 to the portion of body 26 adjacent cover 28. An open ended tribe 36 is formed in rod 34 at the end of rod 34 adjacent cover 28. A spring 38 is disposed in hollow body 26 adjacent cover 28 and rod 34. One end 40 of spring 38 is inserted in tube 36 to establish electrical contact between rod 34 and spring 38. End 40 is attached to tube 36 by welding, crimping or any other suitable means.

The other end 42 of spring 38 is mounted within a tube 44. Preferably, tube 44 is formed from brass, but any electrically conductive material may be used. Tube 44 is welded to or crimped about end 42 of spring 38 in order to make an immovable electrical contact between spring 38 and tube 44.

Electrically conductive element 16 extends from end 23 of cord 14 into tube 44. Tube 44 is soldered to or crimped about element 16 in order to make an immovable electrical contact between element 16 and tube 44. Rod 34, spring 38 and tube 44 establish electrical communication between tip 24 and electrical element 16 of cord 14.

An elastomeric plug 46 surrounds a portion of tube 44 and end 22 of cord 14. Plug 46 has a circumferential collar 48 disposed within body 26 and a circumferential collar 50 disposed outside body 26. The positions of tube 44 and cord 14 are fixed with respect to plug 46.

In its normal operating position, collar 50 abuts surface 52 of stylus 10. If, however, stylus 10 is extended beyond the normal limits of cord 14, plug 46 will slide out of stylus 10. This movement will expand spring 38. Despite this movement, the electrical connection between the stylus tip 24 and the computer will remain unbroken. The range of movement of plug 46 is limited by the interaction of collar 48 and surface 54 of body 26. When the extraordinary tension on cord 14 ceases, spring 38 will return to its unstretched state and plug 46 will return to its normal position. Thus, as shown in FIGS. 1 and 2, point "A" on cord 14 is normally at a distance "X" from surface 52 of stylus 10 but may move the distance marked "Y" without breaking the electrical communication between the computer and stylus 1? .

An alternative embodiment of this invention is shown in FIGS. 3 and 4. As in the previous embodiment, tip 24 of stylus 10 is electrically connected to computer 12 via cord 14. In this embodiment, however, cord 14 extends through body 26 of stylus 10 to tip 24. Tip 24 has a bore 56 and a smaller diameter counterbore 58 formed in the portion of tip 24 extending into body 26 and away from contact portion 30. A portion of electrically conductive element 16 extends beyond cord insulator 18 and makes electrical contact with counterbore 58. The end of insulator 18 is fixedly mounted in bore 56.

A metal crimp 60 is placed about cord 14 within body 26. The outer diameter of crimp 60 is slightly smaller than the inner diameter of body 26 so that crimp 60 may move longitudinally within body 26. Abutting crimp 60 is a spring 62 disposed about cord 14 between crimp 60 and a collar 64 formed in body 26. Spring 62 may be made from metal or plastic. As in the preferred embodiment, an elastomeric plug 46 surrounds cord 14.

When spring 62 is in its relaxed state, the portion 66 of cord 14 lying within section 68 of body 26 contains some slack, preferably 0.25 inch. In its normal operating position, collar 50 of plug 46 abuts surface 52 of stylus 10. If, however, cord 14 is pulled beyond its normal position, plug 46 will slide out of body 26, thereby compressing spring 58 and straightening slack portion 66. The movement of plug 46 is limited by the interaction of collar 48 and surface 54 of body 26. When the extraordinary tension on cord 14 ceases, spring 58 will return to its uncompressed state and plug 46 will return to its normal position.

We claim:

1. An electrical conductor tensioning apparatus comprising
   a first electrical conductor;
   a device in electrical communication with the electrical conductor, the electrical conductor having a point which is a first predetermined distance from the device;
   means for allowing the point on the electrical conductor to be moved a second predetermined distance away from the device without breaking the electrical communication between the electrical conductor and the device, said means for allowing comprising a spring in electrical communication with the electrical conductor and with the device.

2. The apparatus of claim 1 further comprising a second conductor in electrical communication with the spring, the first conductor and the device,
   the spring, first and second conductors being connected in series.

3. The apparatus of claim 2 wherein the spring has first and second ends, the first end being attached to the first electrical conductor and the second end being attached to the second electrical conductor.

4. The apparatus of claim 3 wherein the spring, the second conductor, and the device are disposed within a housing.

5. An electrical conductor tensioning apparatus for use between a computer and a stylus for the computer comprising
   a first electrical conductor communicating a computer a stylus, the electrical conductor having a point which is a first predetermined distance from the stylus; and
   means for allowing the point on the electrical conductor to be moved a second predetermined distance away from the stylus without breaking the electrical communication between the electrical conductor and the stylus, said means for allowing comprising a spring in electrical communication with the electrical conductor and with the stylus.

6. The apparatus of claim 5 further comprising a second conductor in electrical communication with the spring, the first conductor and the stylus,
   the spring, first and second conductors being connected in series.

7. The apparatus of claim 6 wherein the spring had first and second ends, the first end being attached to the first electrical conductor and the second end being attached to the second electrical conductor.

8. The apparatus of claim 7 wherein the spring, the second conductor, and the tip are disposed within a housing.

9. An electrical conductor tensioning apparatus for use between a computer and a stylus for the computer comprising
   a first electrical conductor communicating a computer and a stylus, the electrical conductor having a point which is a first predetermined distance from the stylus; and
   means for allowing the point on the electrical conductor to be moved a second predetermined distance away from the stylus without breaking the electrical communication between the electrical conductor and a stylus housing, said means for allowing being housed within the stylus.

10. The apparatus of claim 9 wherein the means for allowing comprises a spring.

11. The apparatus of claim 10 wherein the spring surrounds the conductor, the spring being movable between a relaxed state and a compressed state, the spring maintaining slack in the conductor when the spring is in the relaxed state.

12. The apparatus of claim 11 wherein the spring is disposed within the stylus.

13. The apparatus of claim 10 wherein the spring is in electrical communication with the stylus and the conductor.

14. The apparatus of claim 13 further comprising a second conductor in electrical communication with the spring, the first conductor and the stylus,
   the spring, first and second conductors being connected in series.

15. The apparatus of claim 14 wherein the spring and the second conductor are disposed within the stylus housing.

* * * * *